United States Patent [19]
Tsuchiaki

[11] Patent Number: 5,444,007
[45] Date of Patent: Aug. 22, 1995

[54] FORMATION OF TRENCHES HAVING DIFFERENT PROFILES

[75] Inventor: Masakatsu Tsuchiaki, Fishkill, N.Y.

[73] Assignee: Kabushiki Kaisha Toshiba, Kanagawa, Japan

[21] Appl. No.: 283,162

[22] Filed: Aug. 3, 1994

[51] Int. Cl.$^6$ ......................................... H01L 21/265
[52] U.S. Cl. ........................ 437/35; 437/947; 437/981; 437/67; 148/DIG. 161; 148/DIG. 50
[58] Field of Search ............ 437/35, 67, 981, 947; 148/DIG. 50, DIG. 161

[56] References Cited

U.S. PATENT DOCUMENTS

| | | | |
|---|---|---|---|
| 3,769,109 | 10/1973 | MacRae et al. | 156/3 |
| 3,808,068 | 4/1974 | Johnson et al. | 156/8 |
| 3,908,262 | 9/1975 | Stein | 29/579 |
| 4,093,503 | 6/1978 | Harris et al. | 156/628 |
| 4,147,564 | 4/1979 | Magee et al. | 148/1.5 |
| 4,268,347 | 5/1981 | Stephens | 156/628 |
| 4,377,437 | 3/1983 | Taylor et al. | 156/628 |
| 4,634,494 | 1/1987 | Taji et al. | 156/628 |
| 4,652,334 | 3/1987 | Jain et al. | 156/628 |
| 4,679,311 | 7/1987 | Lakhani et al. | 29/579 |
| 4,718,973 | 1/1988 | Abraham et al. | 437/981 |
| 4,756,793 | 7/1988 | Peek | 437/67 |
| 4,832,788 | 5/1989 | Nemiroff | 437/947 |
| 4,863,556 | 9/1989 | Reichert | 156/628 |
| 4,978,418 | 12/1990 | Arnold, Jr. et al. | 156/628 |
| 5,001,080 | 3/1991 | Wada et al. | 437/51 |
| 5,308,786 | 5/1994 | Lur et al. | 437/67 |

FOREIGN PATENT DOCUMENTS

| | | | |
|---|---|---|---|
| 0039429 | 2/1990 | Japan | 437/981 |
| 0029281 | 2/1993 | Japan | 437/981 |

*Primary Examiner*—Brian E. Hearn
*Assistant Examiner*—Trung Dang
*Attorney, Agent, or Firm*—Banner & Allegretti, Ltd.

[57] ABSTRACT

Trenches having different profiles are formed in a material, such as a semiconductor substrate, by forming a resist pattern having windows with at least two different widths. An etchant, such as Fluorine, is implanted into portions of the semiconductor using an ion implantation technique. A tilt angle and an azimuth angle of the ion beam are chosen such that the Fluorine ions cannot pass through narrower resist windows but can pass through wider resist windows to impinge on the underlying semiconductor substrate. The semiconductor substrate is then subjected to an anisotropic etching process. Accordingly, the substrate regions exposed between the narrow-width resist windows are etched to produce trenches having highly vertical profiles. The substrate regions exposed by the wide-width resist windows, including the regions having implanted etchant ions, are preferentially etched to produce trenches having tapered profiles.

20 Claims, 8 Drawing Sheets

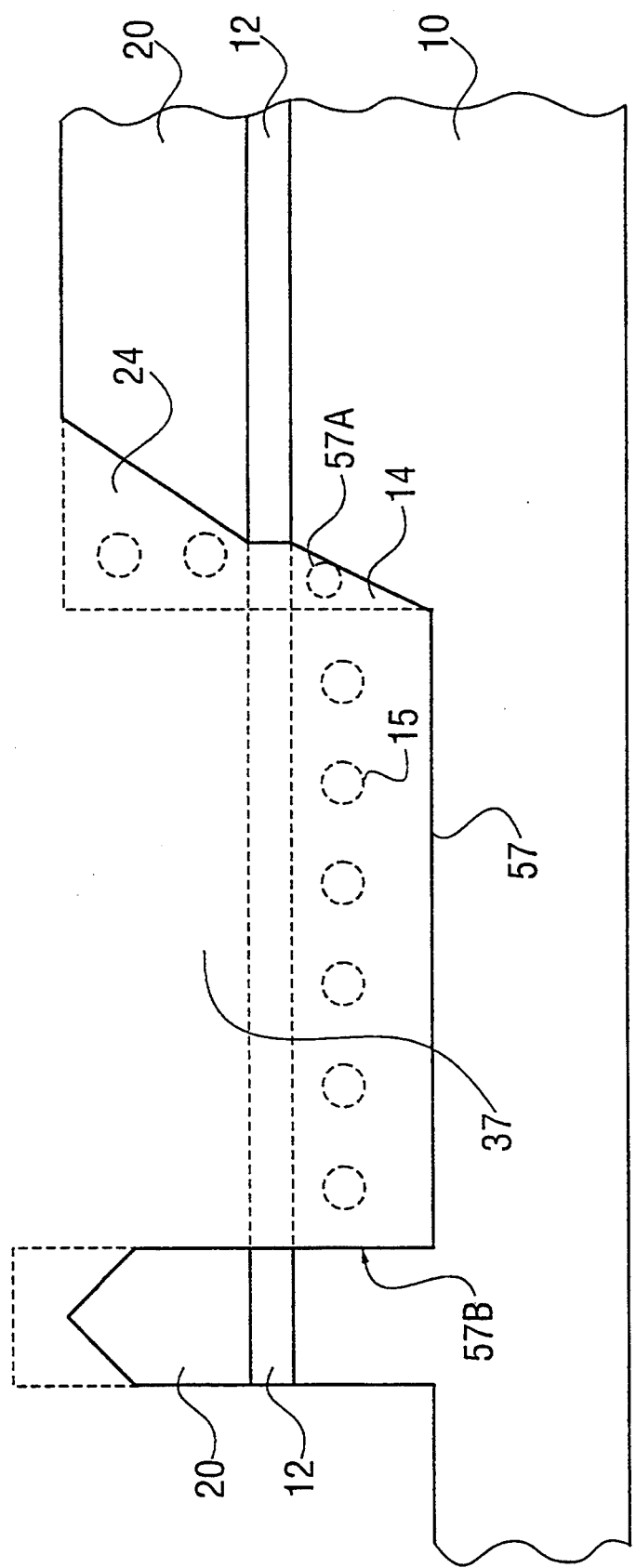

FORMATION OF TRENCHES HAVING DIFFERENT PROFILES

FIELD OF THE INVENTION

The invention generally relates to the formation of trenches in a material, and more particularly to the formation of trenches having different profiles by implanting etchants in a material, such as a semiconductor substrate, through a resist pattern and etching the resulting structure.

BACKGROUND OF THE INVENTION

The discrete circuits of an integrated circuit chip can be isolated from one another using shallow trenches formed in the semiconductor substrate. This technique is appropriately known as shallow trench isolation (STI). Many semiconductor chips have semiconductor devices of various sizes. In these semiconductor chips, the same sized semiconductor devices often are organized in distinct regions. For example, dynamic random access memory (DRAM) chips include array regions comprising relatively small memory cells and peripheral regions comprising relatively large devices, such as decoder circuitry and other peripheral circuitry. FIG. 1A provides a circuit diagram that illustrates this arrangement. As shown in FIG. 1A, a conventional DRAM includes a peripheral circuit region i and a memory cell array region 2.

The memory cell array region 2 includes memory cells formed at the intersections of word lines and bit lines. For convenience, only memory cell 3 formed at the intersection of a word line WL and bit lines BL and /BL is shown. The peripheral circuit region 1 includes various peripheral circuit elements for selecting memory cells, including memory cell 3, coupled to word line WL. For example, the peripheral circuit region 1 includes an p-channel field effect transistor (FET) 4 and a n-channel FET 5. The control gates of FETs 4 and 5 are each connected to selection circuitry 6. A first terminal of each of the FETs are connected in common to word line WL. A second terminal of the p-channel FET 4 receives a word line drive signal WDRV. A second terminal of the n-channel FET 5 is coupled to ground.

FIG. 1B illustrates a plan view of the DRAM of FIG. 1A with associated resist patterns 1' and 2' for forming peripheral circuit region 1 and memory cell array region 2, respectively. The resist pattern 2' corresponding to the memory cell array region 2 includes a plurality of relatively small individual resist areas, including individual resist area 3' corresponding to memory cell 3. Resist pattern 1', corresponding to the peripheral circuit region 1, has relatively large individual resist areas 4' and 5' corresponding to FETs 4 and 5, respectively. The large individual resist areas of resist pattern 1' are spaced further apart than the small individual resist areas of resist pattern 2'. Accordingly, relatively large peripheral circuit elements can be formed in peripheral circuit region 1 and relatively small memory cells can be formed in memory cell array region 2.

Several problems arise when different sized devices formed in a single semiconductor chip are isolated using trenches. For example, power dissipation may unduly limit circuit performance. Trenches with highly vertical profiles have sharp corners at their edges. The electrical field at these sharp corners differs, for example, from the electrical field near the center of the channel of a transistor, and, as a result, a lower threshold voltage occurs near the sharp corners. Consequently, a leakage current is produced because an operating current is not cut off effectively due to the lower threshold voltage. Relatively large devices that operate with large currents, such as the peripheral circuitry in a DRAM, produce a significant leakage current. The leakage current dissipates power in the chip resulting in inefficient operation. In order to suppress power dissipation, large devices may be isolated with trenches having a tapered profile to relax the corner angles and thus minimize the leakage current.

Smaller devices are less sensitive than larger devices to the detrimental effects of sharp corners. The characteristics of smaller devices, such as memory cells in an array, tend to depend more on the shape of the entire region rather than on a sharp corner in a local area. Moreover, tapered trenches can lead to misalignments in later processing steps that could cause the devices in denser arrays to malfunction. Therefore, smaller devices are preferably isolated with trenches having vertical profiles in order to ensure a very precise alignment without unduly sacrificing performance characteristics.

Vertical trenches and tapered trenches could be formed in the same semiconductor substrate by effecting two distinct etching steps, each requiring a separate lithography step to mask protected areas. This process is time consuming, inefficient, and expensive, among other disadvantages. Alternatively, vertical and tapered trenches could be formed by deposition film development during the etching step. However, such procedure is dependent upon numerous variables such as etching conditions, chamber seasoning, total loading of the substrate, micro-loading, among various other parameters, and therefore is extremely difficult to control.

Accordingly, there is a need to provide in a single semiconductor chip both vertical trenches to isolate small devices and tapered trenches to isolate large devices. Further, there is a need to achieve this result without requiring complicated and expensive processing.

SUMMARY OF THE INVENTION

According to the present invention, trenches having different profiles are formed in a material, for example, a semiconductor substrate. A resist pattern or other mask material pattern having first and second windows is formed on the material. The width of the second window is greater than that of the first window. The resist pattern and material are subjected to ion bombardment using ions of an etchant, such as Fluorine, or a non-etchant, such as Argon. The ions are directed at the resist pattern and material at predetermined angles with respect to the surface normal and standard azimuth direction of the material. The predetermined angles are selected such that the ions impinge on the material through the wider second window but do not reach the material through the narrower first window.

The surfaces of the material and the resist pattern are then subjected to an etching step, for example, an anisotropic reactive ion etching step, to form first and second trenches corresponding to the first and second windows, respectively. The material exposed by the first window, which was not subject to ion bombardment, is etched away to form the first trench with a substantially vertical profile. The material exposed by the second window and subject to ion bombardment is etched away to form the second trench having a substantially tapered profile. The etching step proceeds preferentially in the region of the second window due to the impact of the ion bombardment and the chemical effect of the implanted ions, if etchants.

Accordingly, the present invention enables the formation of trenches having different profiles in a single etching step. Further, by adjusting parameters such as window width, the angles of incidence of the ions, and the energy of the ions, for example, the slope of the second trench may .be easily controlled. The present invention may be utilized to form substantially vertical trenches in an array region of a semiconductor memory device, such as a DRAM, and to form substantially tapered trenches in a peripheral region of the memory device. Thus, substantially vertical trenches can be used to isolate memory cells to facilitate alignment and substantially tapered trenches can be used to isolate peripheral devices to suppress power dissipation.

BRIEF DESCRIPTION OF THE DRAWINGS

A more complete appreciation of the present invention and many of the attendant advantages thereof will be readily obtained as the invention becomes better understood by reference to the following detailed description when considered in connection with the accompanying drawings.

FIG. 4 shows an expanded view of a semiconductor substrate similar to that of FIGS. 3D and 3E after etching is concluded.

DETAILED DESCRIPTION OF THE PREFERRED EMBODIMENTS

Figure 1A:
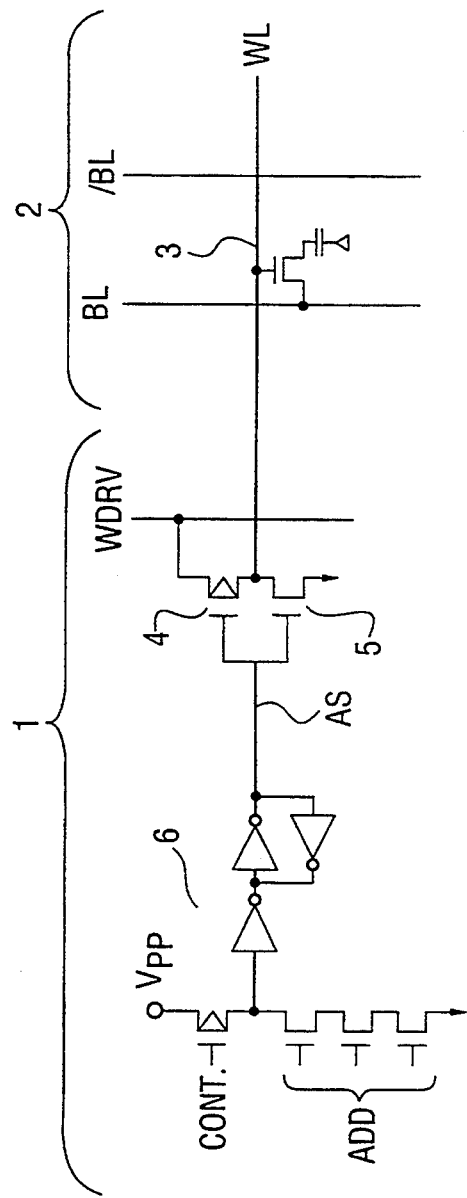
FIG. 1A illustrates conventional circuitry in a dynamic random access memory (DRAM).
Figure 1B:
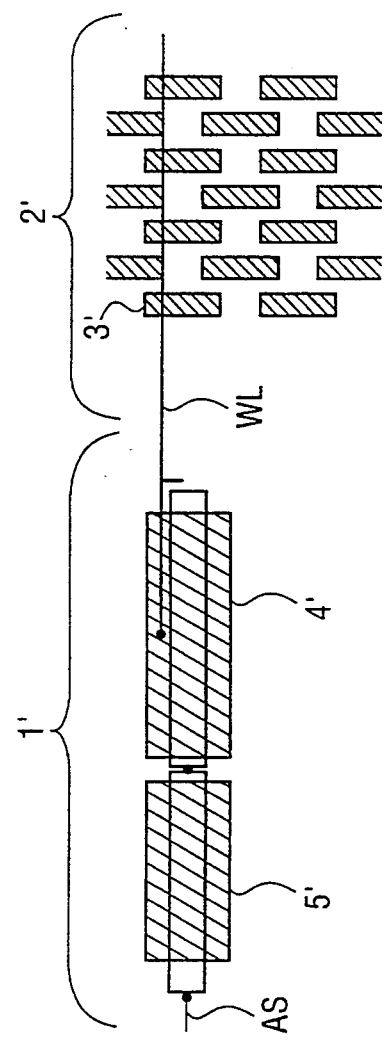
FIG. 1B illustrates a plan view of the DRAM of FIG. 1A with associated resist patterns for a peripheral circuit region and a memory cell array region.
Figure 2A:
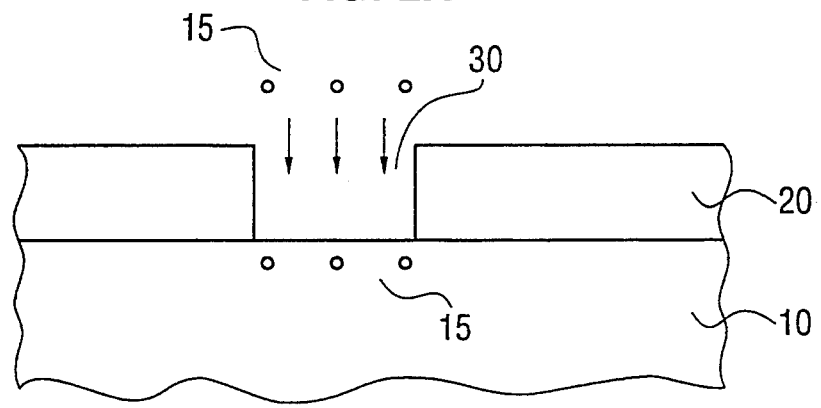
FIGS. 2A and 2B illustrate the general principle of incorporating an etchant and/or non-etchant by ion implantation and etching.

The general principles of the invention will be discussed in connection with FIGS. 2A and 2B. A resist pattern 20 is formed on a semiconductor substrate 10 according to well known methods, for example, lithography. However, the present invention is not limited to resist as a masking material. While the invention will be described using resist as the masking material for convenience, it should be understood that any other mask material may be used consistent with the present invention. The resist pattern 20 includes a window 30 to the semiconductor substrate 10. An etchant material 15, such as Fluorine, is incorporated into the semiconductor substrate 10, for example, by ion implantation through window 30. It should be understood that the present invention is not limited to the use of Fluorine as an etchant. Other etchants, such as Chlorine, may also be used. Alternatively, non-etchants such as Argon, for example, may be implanted. Further, a combination of etchants and non-etchants may be used in a single implantation step or in plural implantation steps.

Figure 2B:
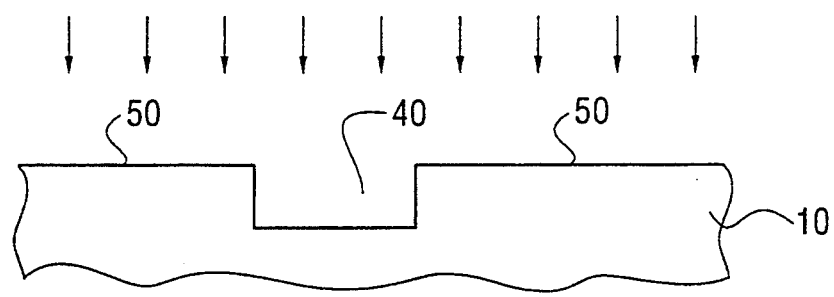

As shown in FIG. 2B, the substrate 10 and resist 20 are then etched to produce a trench 40 in the region where the etchant was implanted. The resist pattern may be removed at this time as well. Of course, the resist pattern 20 may be removed before etching. Etching may accomplished according to a highly anisotropic reactive ion etching (RIE) process, such as a preferential ion assisted or ion enhanced etching procedure where the substrate is immersed in a plasma of etchant, for example, Fluorine or Chlorine, and subjected to ion bombardment using, for example, ionized Argon. Alternatively, the plasma may have little or no Fluorine in order to more precisely control the critical dimensions of small features. Also, other etching techniques may also be used, for example, ion beam etching. The trench 40 may be filled in accordance with a variety of techniques not important for the present invention. Devices may be formed in the regions 50 of the semiconductor substrate 10 so that the devices are isolated by the filled trench 40. Accordingly, STI can be achieved.

The ion implantation step ensures preferential etching of the ion implanted regions. Bombardment by etchant or non-etchant ions causes physical damage to the substrate. The damaged substrate regions etch at a greater rate than undamaged substrate regions. Thus, implantation of a non-etchant serves to speed the etching rate by physically damaging the impact region. Further, if an etchant is implanted, the etchant serves to break chemical bonds in the substrate. Accordingly, the implanted etchant speeds the etching rate by both physical and chemical mechanisms.

Figure 3A:
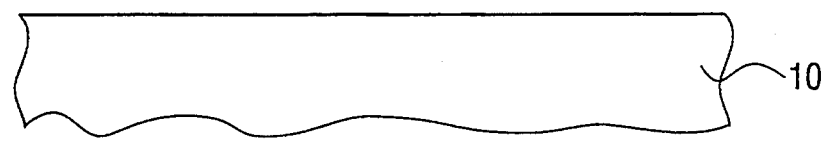
FIG. 3A illustrates a semiconductor substrate.

FIG. 3A shows a substrate 10, for example, silicon, to be processed according to the present invention. Of course, other semiconductor substrates or other materials may be used in accordance with the present invention. Further, the semiconductor substrate 10 may comprise a plurality of layers of different materials, for example, silicon nitride on a silicon substrate. For convenience, element 10 will be referred to as semiconductor substrate 10.

Figure 3B:
FIG. 3B illustrates a mask formed on the semiconductor substrate of FIG. 3A.
Figure 3C:
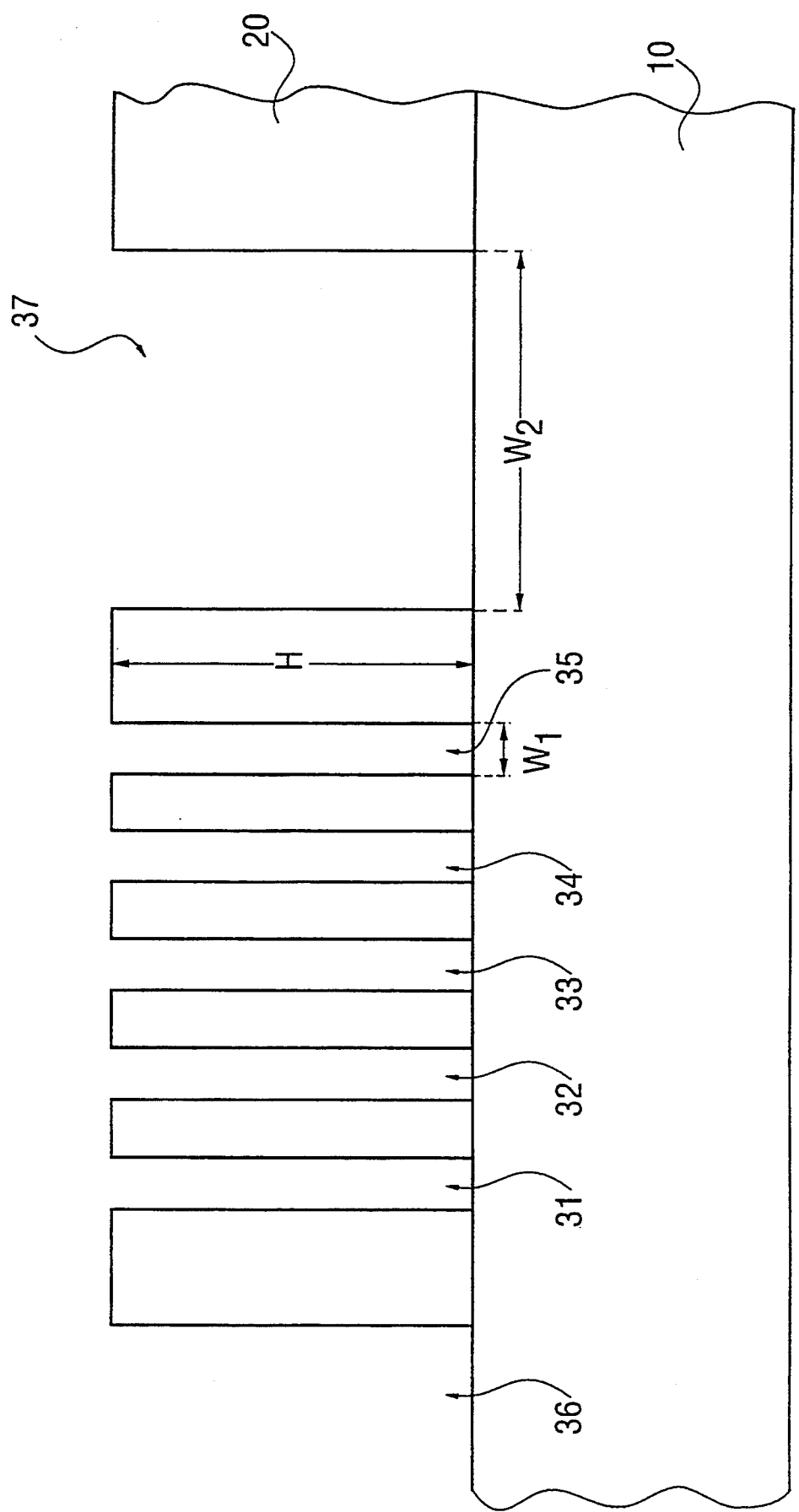
FIG. 3C illustrates a resist pattern formed in an array region on the semiconductor substrate of FIG. 3B.

As shown in FIG. 3B, a resist film 20A is formed on the semiconductor substrate 10. As noted above, mask materials other than resist may be used consistent with the present invention. The resist film 20A is subjected to known photolithography techniques to form a resist pattern 20 as illustrated in FIG. 3C. As shown in FIG. 3C, the resist pattern 20 includes a plurality of windows 31–37 that expose a surface of the semiconductor substrate 10. Of course, resist pattern 20 is intended to illustrate the principles of the present invention, and should not be construed to limit the invention. The resist pattern 20 has a height H, which may be, for example, 0.95 μm. As can be seen, windows 31–35 have a first width W1, and windows 36 and 37 have a second width W2, where W2>W1. For example, W1 may be about 0.25 μm and W2 may be about 10 μm. Of course, the arrangement shown in FIG. 3C is intended to be illustrative and should not be considered to limit the present invention. For example, the resist height H may be varied, and any number of windows having any window width W may be provided consistent with the present invention.

Figure 5A:
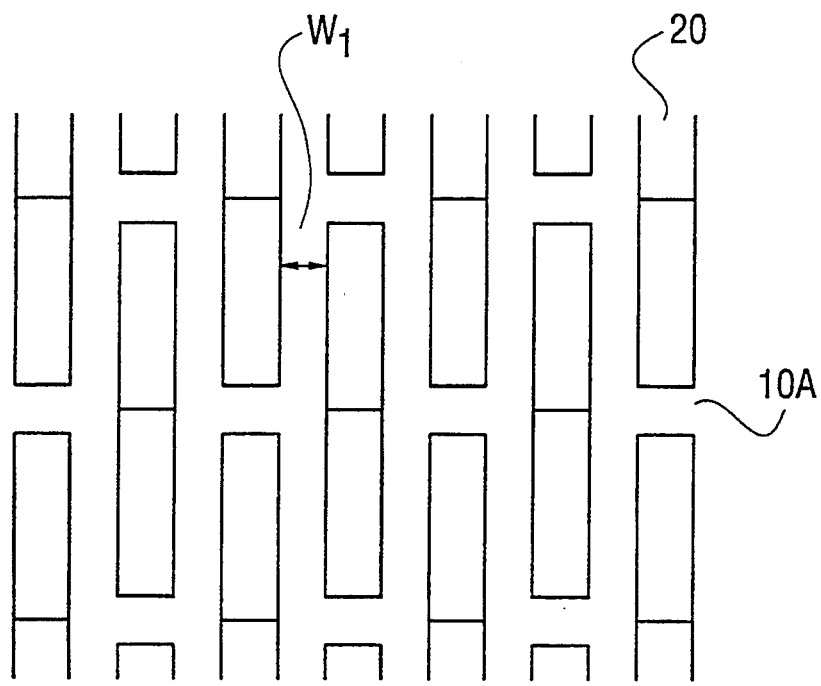
FIG. 5A illustrates a plan view of a resist pattern formed in a memory cell array region 10A of a memory device.

In general, windows 31–35 may be formed in a first region of semiconductor substrate 10 where it is desired to have trenches having a first characteristic trench profile, and windows 36 and 37 may be formed in a second region of a semiconductor substrate 10 where it is desired to have trenches having a second characteristic trench profile. For example, as illustrated in FIG. 5A, the first region may correspond to a memory cell array region 10A of a memory device, such as a DRAM, where relatively small memory cell devices are formed and where trenches having substantially vertical profiles are required to ensure a precise alignment. The memory cell array region 10A includes a resist pattern 20 including windows having the first width W1. Accordingly, vertical trenches may be formed in the memory cell array region 10A.

Figure 5B:
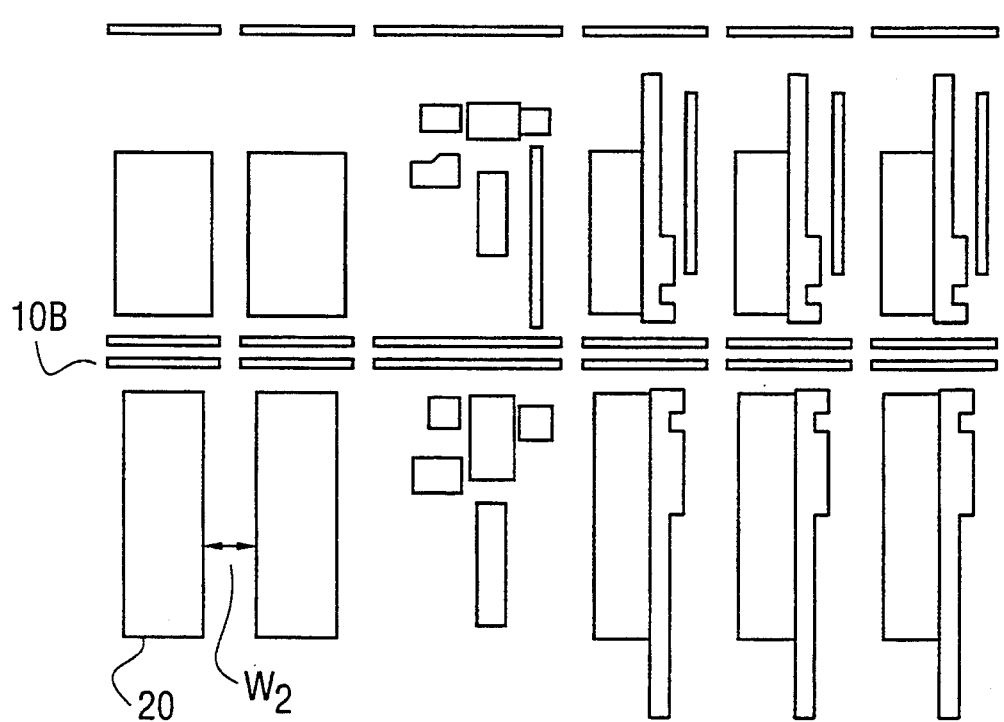
FIG. 5B illustrates a plan view of a resist pattern formed in a peripheral circuit region 10B of a memory device.

As illustrated in FIG. 5B, the second region may correspond to a peripheral circuit region 10B of the memory cell device, such as a DRAM, where relatively large peripheral circuits are formed and where trenches having substantially tapered trench profiles are required to minimize leakage currents and resulting power dissipation. The peripheral circuit region 10B includes a resist pattern 20 including windows having the second width W2. Thus, tapered trenches may be formed in the peripheral circuit region 10B.

Figure 3D:
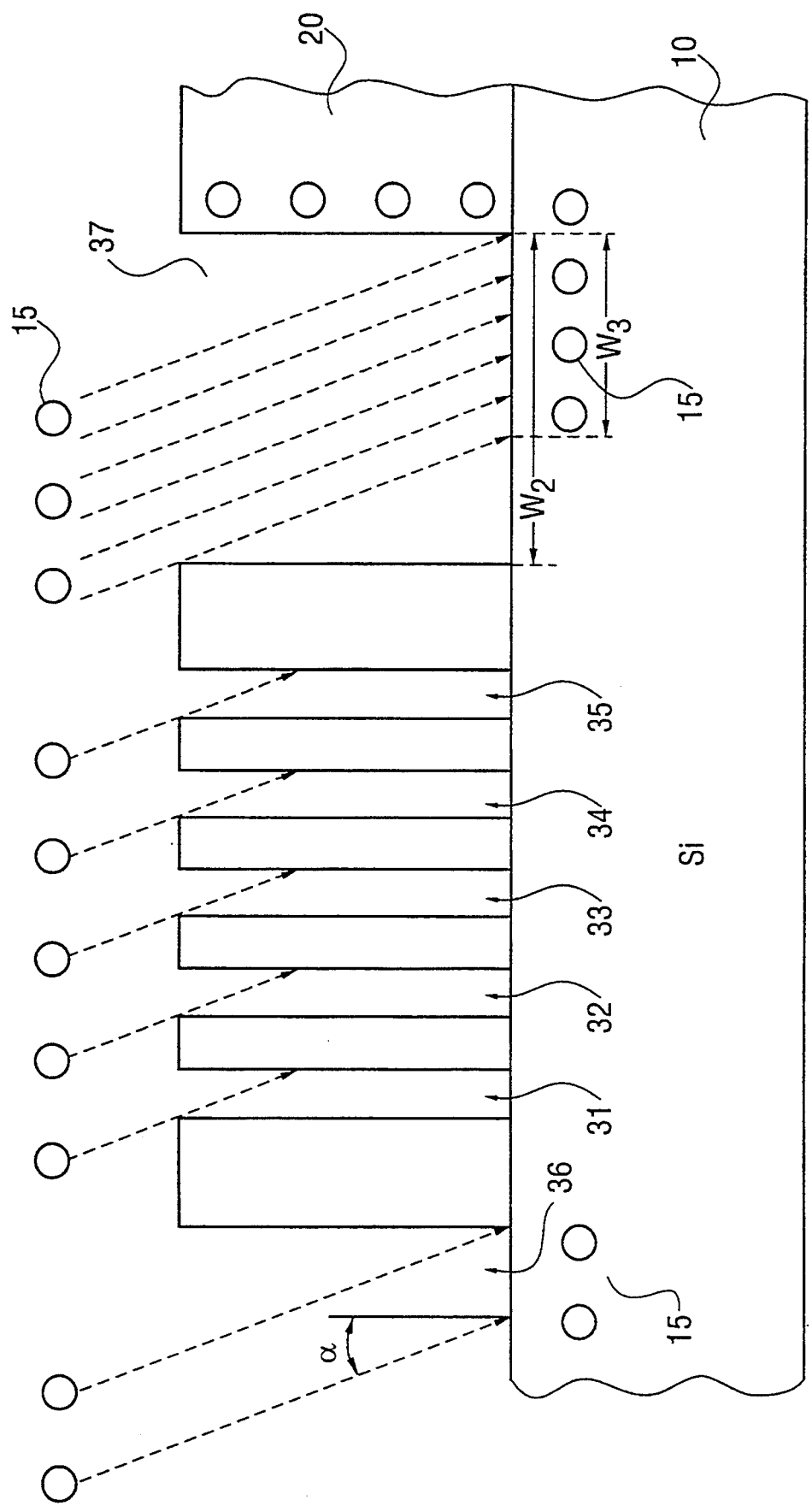
FIG. 3D illustrates tilt implantation of ions into the semiconductor substrate having thereon a mask pattern with windows of different width.
Figure 6:
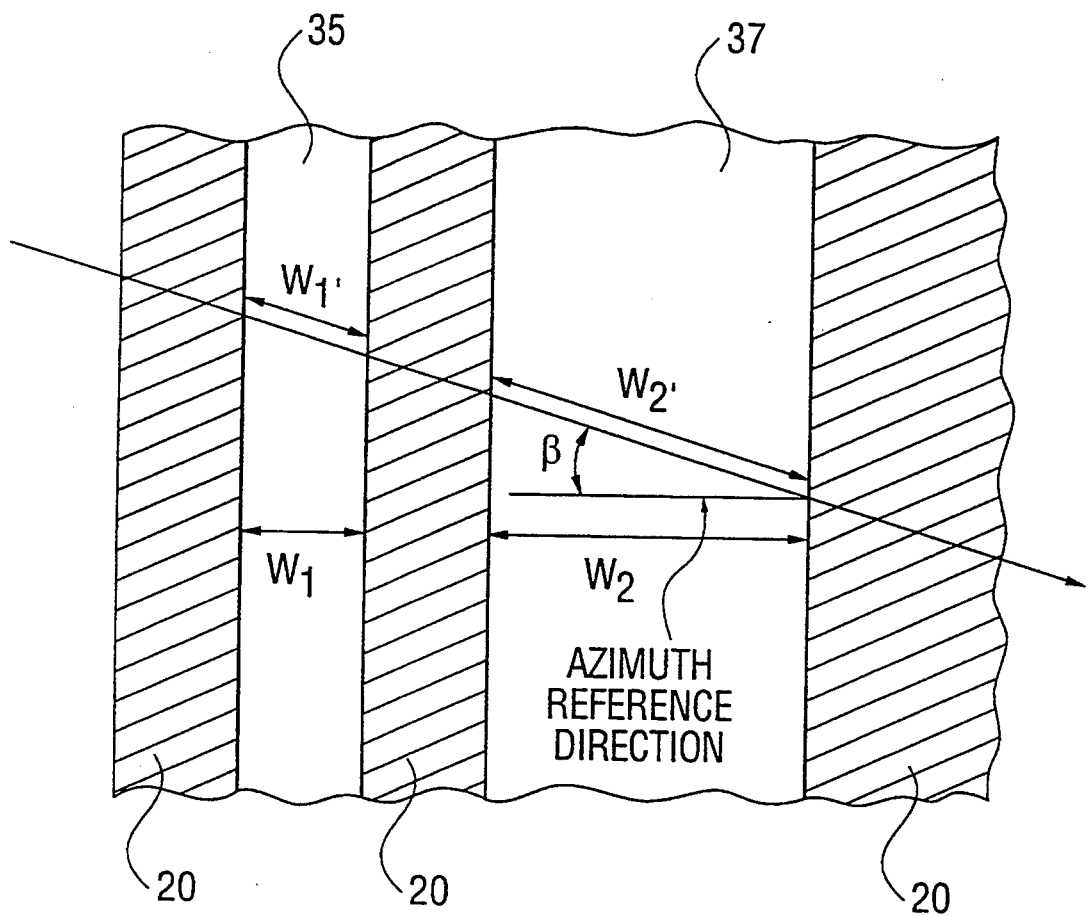
FIG. 6 illustrates a plan view of ions directed at semiconductor substrate at an azimuth angle $\beta$.

After formation of the resist pattern 20, the semiconductor substrate 10 is subjected to a tilt ion implantation procedure, as illustrated in FIG. 3D, whereby the ions 15 are implanted at a predetermined tilt angle $\alpha$ with respect to the surface normal of the semiconductor substrate 10 and a predetermined azimuth angle $\beta$ with respect to an azimuth reference direction. FIG. 6 is a plan view of substrate 10 to illustrate the azimuth angle $\beta$ of the ion beam with respect to an arbitrary azimuth reference direction. The tilt angle $\alpha$ and azimuth angle $\beta$ may be selected such that the implantation ions pass through windows 36 and 37 to reach the portion W3 of the surface of the semiconductor substrate 10 but do not pass through windows 31–35 to reach to the surface of the semiconductor substrate 10. W3 may be varied in accordance with the tilt angle $\alpha$, the azimuth angle $\beta$, and the resist height H.

For example, for a given resist pattern height H and window widths W, an appropriate tilt angle $\alpha$ and azimuth angle $\beta$ may be selected to produce an implant area W3 in the semiconductor substrate 10, to achieve a desired implant profile and thus a trench having a desired taper profile. The following relation may serve as a guideline for the selection of a tilt angle $\alpha$ and an azimuth angle $\beta$:

$$W1' < H \tan \alpha < W2'$$

where:
W1'=W1/cos $\beta$; and
W2'=W2/cos $\beta$.

Further, the ions can be beamed at a predetermined implantation energy to achieve predetermined depth in the semiconductor substrate 10. Preferably, ion energies of 10 KeV or greater are utilized. In addition, an implantation dose may be selected to achieve a predetermined concentration in the semiconductor substrate 10 where they strike. In general, higher implant concentrations produce greater physical damage and, if the implanted ion is an etchant, greater chemical damage. Thus, the implantation energy and implantation dose of the ions are among the factors which affect the etch rate, and thus the resulting trench profile. Of course, the etch rate also depends on the material etched, the implanted material, and the reactive ion etching process.

As depicted in FIG. 3D for purposes of illustration, ions of the etchant Fluorine are used to bombard the semiconductor substrate 10 and resist pattern 20 at a tilt angle $\alpha$. The azimuth angle $\beta$ of the ion beam is aligned with the plane of the page. The Fluorine ions strike the top part of the resist pattern adjacent windows 31–35 but do not reach the semiconductor substrate through windows 31–35. Accordingly, areas of the semiconductor substrate 10 exposed through windows 31–35 are not implanted with ions. The angle $\alpha$ is sufficient to permit the Fluorine ions to strike the semiconductor substrate 10 through windows 36 and 37. The Fluorine ions additionally impinge on the sides of the resist that forms windows 36 and 37. FIG. 3D illustrates the resulting distribution of Fluorine ions implanted in the substrate 10 and the resist pattern 20 from one direction. Of course, the distribution of implanted ions, and thus the trench profile, can be tailored by implanting ions at several different tilt angles $\alpha$ and/or azimuth angles $\beta$. Further, the azimuth angle $\beta$ may be varied with time to effect a rotation implantation.

Figure 3E:
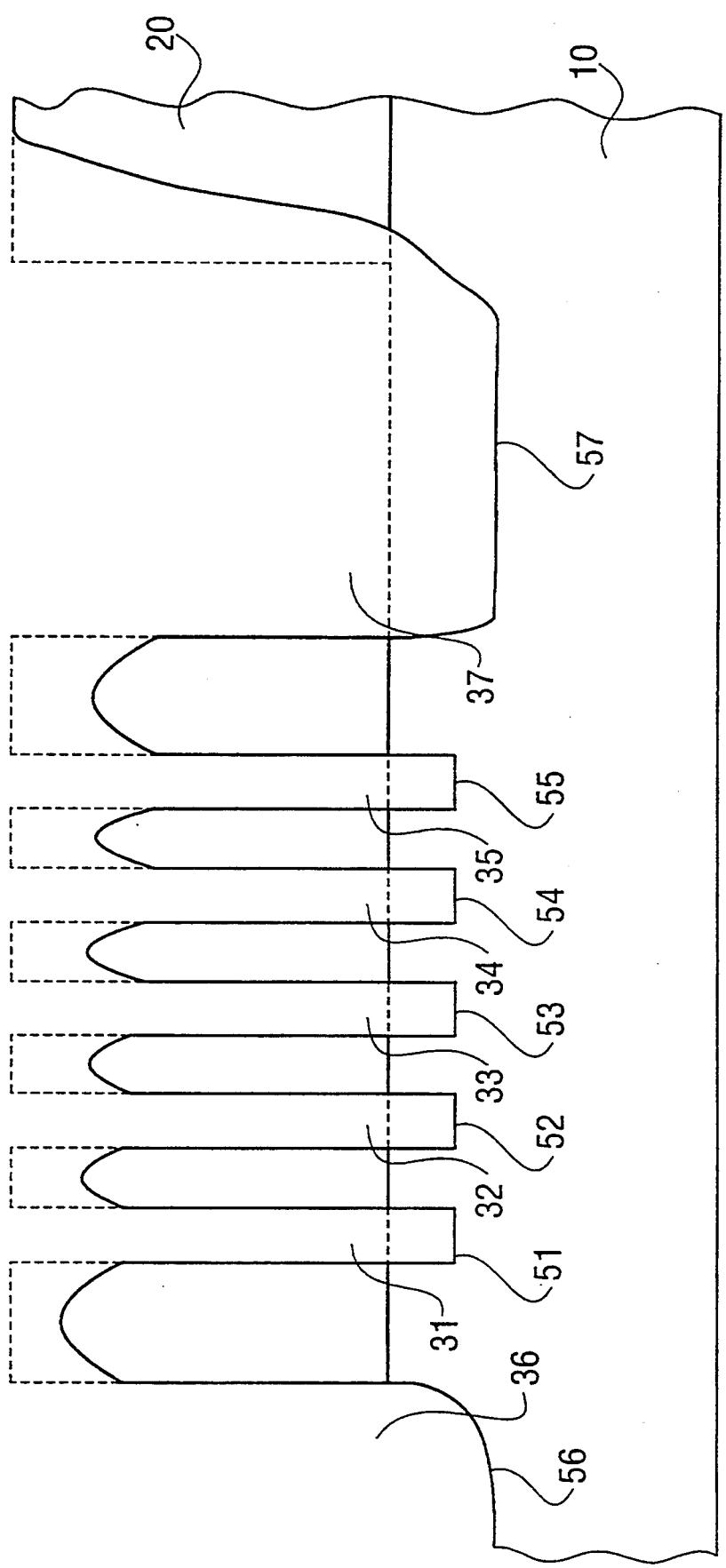
FIG. 3E illustrates the effects of etching on a semiconductor substrate subject to ion implantation according to FIG. 3D.

The semiconductor substrate 10 and the resist pattern 20 are then etched, for example, using a highly anisotropic RIE process. FIG. 3E illustrates the semiconductor substrate according to FIG. 3D after etching. The dotted lines show the outline of the semiconductor substrate 10 and resist pattern 20 before etching. As can be seen, the areas where Fluorine ions were implanted have been etched away to form tapered profile trenches 56 and 57 in the semiconductor substrate 10 at regions corresponding to the windows 36 and 37. In addition, vertical profile trenches 51–55 are formed in the semiconductor substrate 10 at the regions corresponding to windows 31–35 where no implantation occurred. It should be noted that the tapered trenches 56 and 57 may be deeper than vertical trenches 51–55 as a result of the preferential etching produced by the implantation of Fluorine ions.

It should be clear that the particular trench profile produced by the etching step may be precisely tailored to specific requirements by adjusting the ion implant profile. This may be accomplished through careful selection of the relevant parameters affecting implant profile, such as resist height, window width, tilt angle of the ion beam, azimuth angle of the ion beam, energy of the ion beam, and the characteristics of the materials used. For example, a more tapered trench may be produced by increasing the tilt angle and/or the energy of the ion beam. Accordingly, the formation of the taper may be controlled more easily by adjusting the implant profile than by other methods that vary according to etching conditions, etching area, chamber seasoning and the like which tend to be restrict etching parameters and options.

FIG. 4 provides a more detailed view of region similar to that surrounding window 37 of FIG. 3E after etching is concluded. In this case a nitride layer (e.g., SiN) 12 is formed on the surface of the semiconductor substrate 10 prior to forming the resist pattern 20. The structure of the semiconductor substrate 10, the nitride layer 12, and the resist pattern 20 after ion implantation and before etching are shown with dotted lines.

As illustrated, a lateral portion 14 of the semiconductor substrate 10 and a lateral portion 24 of the resist pattern 20 are implanted with Fluorine ions 15 during the tilt implantation phase. Consequently, lateral etching causes lateral portion 14 to be etched during the etching phase. In addition, resist or mask regression is manifest by lateral portion 24 being etched away during the etching phase. Because the resist pattern 20 is generally softer than semiconductor substrate 10, it is etched at a greater rate. Moreover, once an oblique surface is formed in the resist, the surface will be etched at an even greater rate due to the higher sputtering yield of ions at an oblique angle. Thus, lateral portion 24 is etched to a greater extent than lateral portion 14.

The removal of lateral portion 14 through etching forms tapered portion 57A of tapered trench 57. Tapered trench 57 does not produce the sharp corners at its drop off as does a vertical trench. Accordingly, tapered trench 57 is suitable for isolating a peripheral circuit, such as a decoder, without significant power dissipation due to electrical field irregularities. However, tapered trench 57 additionally includes a vertical portion 57B opposite the tapered portion 57A. The semiconductor substrate 10 near vertical portion 57B is not implanted with ions during the ion implantation phase as it is shielded by resist pattern 20. Of course, a second ion implantation phase can be performed where the ion beam angle is adjusted to cause tapered trench 57 to have a tapered portion opposite tapered portion 57A. This may be accomplished, for example, by using an ion beam angle with respect to the substrate equal to $-\alpha$.

In addition, a second ion implantation phase can be implemented. One or more of the parameters of the first implantation phase may be varied in the second implantation to more precisely control the implant profile. For example, the second implantation phase may have a different tilt angle $\alpha$, a different azimuth angle $\beta$, different implant energy, produce a different concentration, and/or include a different implant ion. In this way, the implant profile may be further controlled to produce the desired tapered trench. Alternatively, one or more of such parameters may be varied in a single process step. In any event, the trenches may then be filled according to any of a variety of procedures not important in the context of the present invention.

The invention is described above in connection with a semiconductor substrate. It should be understood that the present invention may be used to form trenches in material other than a semiconductor substrate or in material including layers on a semiconductor substrate. Further, it should be clear that a particular ion implant angle $\alpha$ may be effected by controlling the direction of the ion beam, by tilting the semiconductor substrate 10, or both.

Although illustrative embodiments of the present invention have been described in detail with reference to the accompanying drawings, it is to be understood that the invention is not limited to those precise embodiments and that changes and modifications may be effected therein by those in the art without departing from the scope and spirit of the invention.

I claim:

1. A method of forming trenches in a surface of a material, comprising the steps of:

forming a mask material pattern on said material, wherein the mask material pattern has first and second windows;

bombarding a surface of said material with ions at a predetermined angular orientation with respect to the material surface such that said ions impinge on said material through said first window but not through said second window; and etching said material to form a first trench having a first profile in a region of said first window and a second trench having a second profile in a region of said second window, said first profile being different from said second profile as a consequence of ion impingement in the region of said first window.

2. The method of claim 1 wherein, said material comprises a multi-layered material.

3. The method of claim 1, wherein said material comprises a semiconductor substrate.

4. The method of claim 1, wherein said step of bombarding comprises bombarding a surface of said material with ions of an etchant thereby implanting said etchant ions into said surface of said material, whereby said etching step proceeds preferentially at said surface of said material because of a chemical effect of said etchant ions on said material and physical damage to said material caused by said step of bombarding.

5. The method of claim 4, wherein said etchant ions comprise Fluorine ions.

6. The method of claim 1, wherein said step of bombarding comprises bombarding a surface of said material with ions of a non-etchant thereby implanting said non-etchant ions into said surface of said material, whereby said etching step proceeds preferentially at said surface of said material because of physical damage to said material caused by said step of bombarding.

7. The method of claim 1, wherein said step of etching comprises anisotropic reactive ion etching.

8. The method of claim 1, wherein said step of etching comprises preferentially etching said material in the region of said first window.

9. The method of claim 1, wherein the predetermined angular orientation comprises a predetermined tilt angle with respect to the normal of said surface of said material.

10. The method of claim 1, wherein the predetermined angular orientation comprises a predetermined azimuth angle with respect to an azimuth reference direction.

11. The method of claim 1, wherein said first profile is substantially tapered and said second profile is substantially vertical.

12. The method of claim 11, wherein said step of etching comprises anisotropic reactive ion etching.

13. The method of claim 12, wherein a width of said first window is greater than a width of said second window and said step of bombarding comprises bombarding a surface of said material with ions of an etchant thereby implanting said etchant ions into said surface of said material, whereby said step of anisotropic reactive ion etching proceeds preferentially at said surface of said material because of a chemical effect of said etchant ions on said material and physical damage to said material caused by said step of bombarding.

14. The method of claim 13, wherein said etchant ions comprise Fluorine ions.

15. The method of claim 14, wherein said material comprises a semiconductor substrate.

16. The method of claim 14, wherein said material comprises a multi-layered material.

17. In a method of forming a semiconductor memory device formed on a semiconductor substrate having an array region and a peripheral circuit region, a method of forming isolation trenches in the semiconductor substrate for isolating devices in said array region and devices in said peripheral circuit region comprising the steps of:

forming a mask material pattern on the semiconductor substrate, wherein the mask material pattern has first windows in the peripheral circuit region and second windows in the array region;

bombarding a surface of the semiconductor substrate with etchant ions at a predetermined angular orientation with respect to the semiconductor substrate surface such that said etchant ions impinge on said semiconductor substrate through said first windows but not through said second windows; and etching said semiconductor substrate through said first windows and said second windows to form first trenches having substantially tapered profiles in the peripheral circuit region as a consequence of said impinging etchant ions and second trenches having substantially vertical profiles in the array region.

18. The method of claim 17, wherein said step of etching comprises anisotropic reactive ion etching.

19. The method of claim 17, wherein said etchant ions comprise Fluorine ions.

20. The method of claim 17, wherein the predetermined angular orientation comprises a predetermined tilt angle with respect to a normal of the semiconductor substrate surface and a predetermined azimuth angle.

* * * * *